United States Patent
Mazzochette et al.

[11] Patent Number: 6,147,481
[45] Date of Patent: Nov. 14, 2000

[54] TERMINATION FOR RF CIRCUIT WHICH SENSES CHANGES IN POWER AND WHICH IS NOT TEMPERATURE SENSITIVE

[75] Inventors: Joseph B. Mazzochette, Cherry Hill; Robert Blacka, Pennsauken, both of N.J.; David Markman, Dresher, Pa.

[73] Assignee: EMC Technology LLC, Cherry Hill, N.J.

[21] Appl. No.: 08/866,959

[22] Filed: Jun. 3, 1997

Related U.S. Application Data

[63] Continuation-in-part of application No. 08/773,391, Dec. 27, 1996, abandoned.

[51] Int. Cl.$^7$ ................................................. G01R 23/04
[52] U.S. Cl. ............................................. 324/95; 324/106
[58] Field of Search ...................................... 324/106, 95

[56] References Cited

U.S. PATENT DOCUMENTS

| | | | |
|---|---|---|---|
| 3,611,130 | 10/1971 | Larsen | 324/106 |
| 3,626,290 | 12/1971 | Aslan | 324/106 |
| 4,008,610 | 2/1977 | Larsen et al. | 73/204.15 |
| 4,072,912 | 2/1978 | Pradal | 331/116 R |
| 4,207,538 | 6/1980 | Goel | 330/277 |
| 4,432,247 | 2/1984 | Takeno et al. | 73/862.623 |
| 5,726,564 | 3/1998 | Takashima | 323/367 |

*Primary Examiner*—Diep N. Do
*Assistant Examiner*—Russell M. Kobert
*Attorney, Agent, or Firm*—Donald S. Cohen

[57] ABSTRACT

A circuit for determining power changes in an RF circuit includes first and second temperature sensitive resistors connected in parallel with an RF input terminal so as to have a common junction therewith. The first resistor has a positive temperature coefficient of resistance and the second resistor has a negative temperature coefficient of resistance. A DC input terminal is connected to one of the temperature sensitive resistors and an output terminal is connected to the common junction of the two temperature sensitive resistors. Third and fourth temperature sensitive resistors have a common junction. The third resistor has a positive temperature coefficient of resistance and the fourth resistor has a negative temperature coefficient of resistance. The DC input terminal is also connected to one of the third and fourth temperature sensitive resistors, and an output terminal is connected to the common junction of the third and fourth temperature sensitive resistors. To improve the linearity of the circuit at high powers, each of the individual temperature sensitive resistors can be replaced with a pair of temperature sensitive resistors, one having a positive temperature coefficient of resistance and the other having a negative temperature coefficient of resistance. In such circuit four output terminals are provided with each output terminal being connected to the junction between the temperature sensitive resistors of each pair.

29 Claims, 4 Drawing Sheets

TERMINATION FOR RF CIRCUIT WHICH SENSES CHANGES IN POWER AND WHICH IS NOT TEMPERATURE SENSITIVE

This is a continuation-in-part of our application for U.S. patent Ser. No. 08/773,391, filed Dec. 27, 1996, now abandoned.

FIELD OF THE INVENTION

The present invention is directed to a termination for an RF circuit, and, more particularly, to a termination for an RF circuit which senses changes in power.

BACKGROUND

The detection of RF power is a common requirement for many systems. The presence and level of an RF signal may be used to indicate a failure, a query or a performance metric. Many circuits have been designed that function as power detectors using both active and passive devices. Semiconductor devices such as diodes, have been used to detect power. However, such semiconductor devices have many problems. Among these problems are that the devices are generally not linear, they are temperature sensitive, are subject to being adversely affected by static discharge, have limited frequency range and are generally expensive. Passive device, such as bolometers and thermocouples, have also been used, but also have many problems. They generally require additional circuitry to provide the determination of the power so that they are expensive. Also, it would be desirable to have a relatively inexpensive device which can determine changes in power of an RF circuit and also will act as a termination for the circuit.

SUMMARY OF THE INVENTION

A power detector for an RF circuit includes an RF input terminal, and first and second temperature sensitive resistors connected in parallel with respect to the RF input terminal so that the temperature sensitive resistors have a common connection to the input terminal. The first temperature sensitive resistor has a positive temperature coefficient of resistance and the second temperature sensitive resistor has a negative temperature coefficient of resistance. An output terminal is connected to the temperature sensitive resistors, and means for applying a DC voltage is connected to one of the temperature sensitive resistors.

DETAILED DESCRIPTION

Figure 1:
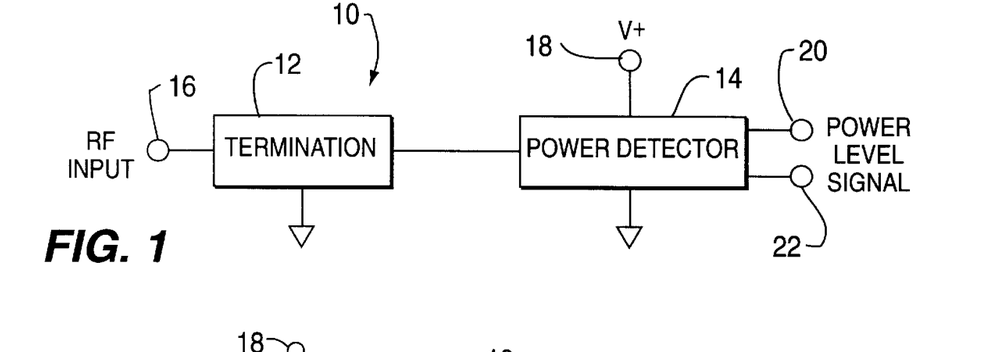
FIG. 1 is a box diagram of the circuit of the present invention.

Referring initially to FIG. 1, the power sensing circuit of the present invention, generally designated as 10, includes a termination portion 12 and a power detector portion 14 connected to the termination portion 12. The circuit 10 includes an RF input terminal 16 which is connected to the termination portion 12 and a DC input terminal 18 connected to the power detector portion 12. The circuit 10 also includes power output terminals 20 and 22 from the power detector portion 14.

Figures 2, 3, 4:
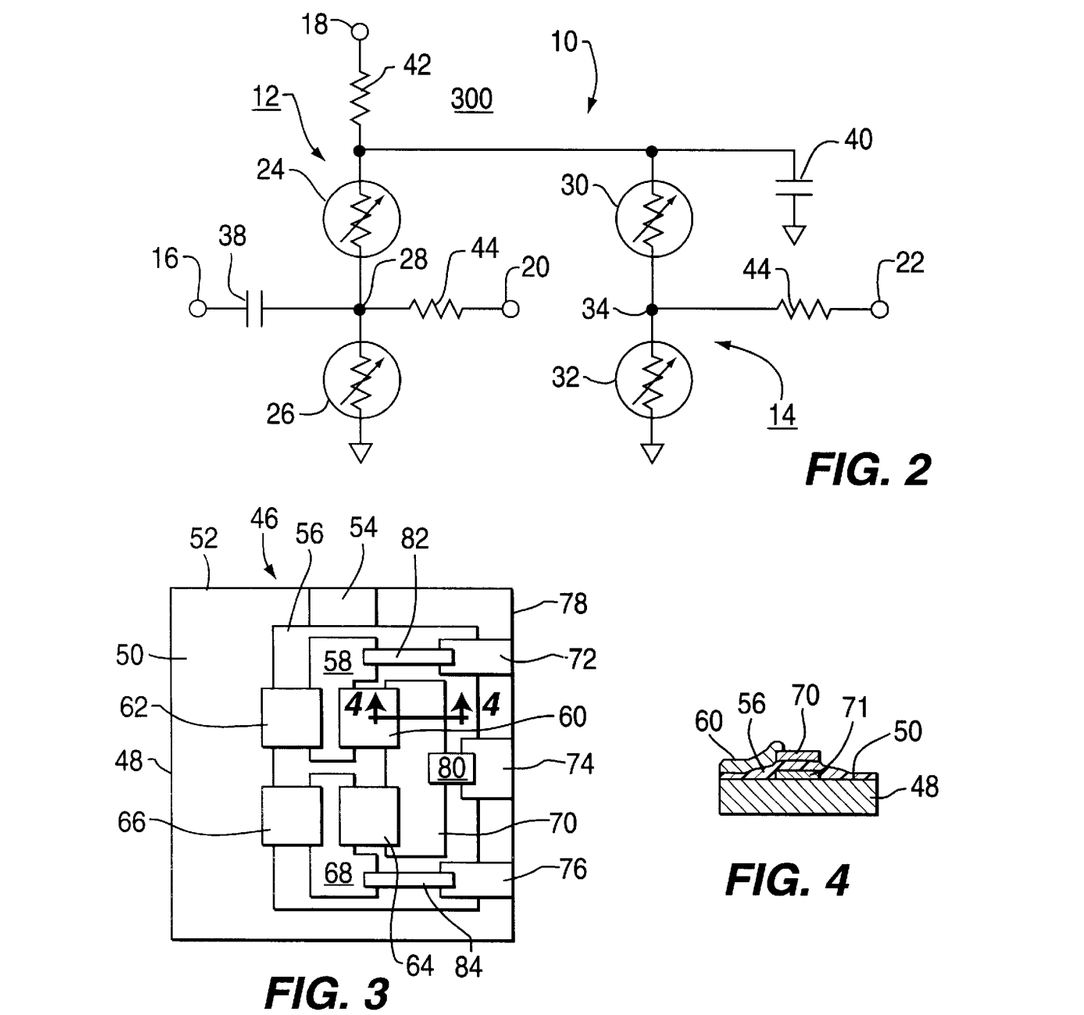
FIG. 2 is a circuit diagram of one form of the circuit of the present invention.
FIG. 3 is a top view of an electronic device forming the circuit shown in FIG. 2.
FIG. 4 is a sectional view taken along line 4—4 of FIG. 3.

Referring now to FIG. 2, there is shown one form of the power detector circuit 10 of the present invention. The termination portion 12 of the circuit 10 comprises first and second temperature sensitive resistors 24 and 26, such as thermistors, connected in parallel with respect to the RF input terminal 16. Thus, the temperature sensitive resistors 24 and 26 have a common connection 28 to the RF input terminal 16. The temperature sensitive resistors 24 and 26 are of the same resistance at room temperature, but the first temperature sensitive resistor 24 has a positive temperature coefficient of resistance, and the second temperature sensitive resistor 26 has a negative temperature coefficient of resistance. The temperature coefficient of resistance of the first and second temperature sensitive resistors 24 and 26 are of the same value but of opposite polarity. One of the output terminals 20 is connected to the common junction 28 of the temperature sensitive resistors 24 and 26. The DC input terminal 18 is connected to the first temperature sensitive resistor 24.

Third and fourth temperature sensitive resistors, such as thermistors, 30 and 32 are connected together with a common connection 34. The third temperature sensitive resistor 30 is substantially identical to the first temperature sensitive resistor 24 in that it has the same nominal resistance value, and has a positive temperature coefficient of resistance of the same amount as that of the first temperature sensitive resistor 24. The fourth temperature sensitive resistor 32 is substantially identical to the second temperature sensitive resistor 26 in that it has the same nominal resistance value, and has a negative temperature coefficient of resistance of the same value as that of the second temperature sensitive resistor 26. Ambient temperature sensing output terminal 22 is connected to the common junction 34 of the third and fourth temperature sensitive resistors 30 and 32, and the DC input terminal 18 is connected to the third temperature sensitive resistor 30.

A coupling capacitor 38 is connected between the RF input terminal 16 and the common junction 28 of the first and second temperature sensitive resistors 24 and 26. A coupling capacitor 40 is connected to the DC input terminal 18. A dropping resistor 42 is connected between the DFC input terminal 18 and the first and third temperature sensitive resistors 24 and 30. A separate isolation resistor 44 is connected between the power sensing output terminal 20 and common junction 28 between the first and second temperature sensitive resistors 24 and 26, and between the ambient temperature sensing terminal 22 and the common junction 34 between the third and fourth temperature sensitive resistors 30 and 32.

In the circuit 10, the first and second temperature sensitive resistors 24 and 26 have a nominal resistance value at room temperature to provide the desired termination resistance for the RF circuit being terminated by the circuit 10. For example, for a 50 ohm termination, each of the first and second temperature sensitive resistors 24 and 26 should have a nominal resistance value of 100 ohms so that the parallel resistance value provide is 50 ohms. RF power provided at the RF input terminal 16 will cause the first and second temperature sensitive resistors 24 and 26 to heat up. Since the first temperature sensitive resistor 24 has a positive temperature coefficient of resistance, the heating of the first temperature sensitive resistor 24 will cause its resistance to increase. However, since the second temperature sensitive resistor 26 has a negative temperature coefficient of resistance, the heating of the second temperature sensitive resistor 26 causes its resistance to decrease the same amount that the resistance of the first temperature sensitive resistor 24 increases. Thus, the parallel resistance value of the first and second temperature sensitive resistors 24 and 26 will remain substantially constant. Therefore, changes in the RF power provided at the RF input terminal 16 will not result in a change in the termination resistance of the termination portion 12 of the circuit 10.

A DC power provided at the DC input terminal 18 is isolated from the RF power by the resistors 44 and the coupling capacitors 38 and 40. A DC voltage at the output terminal 20 is divided between the dropping resistor 42, the first temperature sensitive resistor 24 and the second temperature sensitive resistor 26. Thus, the voltage at the output terminal 20 is dependent on the resistance values of the first and second temperature sensitive resistors 24 and 26. If the RF power at the RF input terminal 16 changes, for example increases, the first and second temperature sensitive resistors 24 and 26 will be heated further so that their resistance values will change. The resistance value of the first temperature sensitive resistor 24 will increase and the resistance value of the second temperature sensitive resistor 26 will decrease. Since the voltage at the output terminal 20 is dependent on the resistance values of the first and second temperature sensitive resistors 24 and 26, changes in these resistance values will cause a change in the voltage at the output terminal 20. The change in the voltage will be proportional to the change in the RF power which caused the change in the resistance values of the first and second temperature sensitive resistors. If the RF power decreases, the voltage at the output terminal 20 will similarly decrease. Thus, by measuring the voltage at the output terminal 20, changes in the RF power can be determined by changes in the output voltage.

Although changes in the voltage at the output terminal 20 result from changes in the resistance values of the first and second temperature sensitive resistors 24 and 26 as a result of changes in the RF power, the resistance values of the first and second temperature sensitive resistors 24 and 26 will also change as a result of changes in the ambient temperature. To compensate for the changes in the ambient temperature, the third and fourth temperature sensitive resistors 30 and 32 are provided. The third and fourth temperature sensitive resistors 30 and 32 are not coupled to the RF input terminal 16 so that they are not affected by the RF power. However, the third and fourth temperature sensitive resistors 30 and 32 are identical in values to the first and second temperature sensitive resistors 24 and 26 respectively, and the same DC current is applied across the third and fourth temperature sensitive resistors 30 and 32 as across the first and second temperature sensitive resistor 24 and 26. Thus, the resistance values of the third and fourth temperature sensitive resistors 30 and 32, and thereby the voltage at the ambient temperature sensing output terminal 22, will vary only as a result of changes in the ambient temperature. Such changes will be identical to the changes caused in the voltage at the output terminal 20 as a result of changes in the resistance values of the first and second temperature sensitive resistors 24 and 26 caused by changes in the ambient temperature. Therefore, by subtracting the voltage at the output terminal 22 from the voltage at the output terminal 20, there is provided a voltage which is directly proportional to the change in the RF power at the input terminal 16. Thus, the circuit 10 of the present invention provides an output which id directly proportional to the RF input power and will indicate any change in the RF input power. However, the termination impedance of the circuit 10 does not change with changes in the RF input power so that there is provided a uniform termination impedance. By using the voltage reference at the ambient temperature sensing output terminal 22 and comparing it to the power output voltage at the output terminal 20, the circuit 10 compensates for variation in ambient temperature that would otherwise cause errors in the power detection.

Although the DC input terminal 18 has been shown as being connected to the first and third temperature sensitive resistors 24 and 30 which have a positive temperature coefficient of resistance, alternatively the DC input terminal 18 can be connected to the second and fourth temperature sensitive resistors 26 and 32 which have the negative temperature coefficient of resistance. In either case, the circuit 10 will operate in the same manner to sense changes in the RF power. Also, the isolation resistors 44 may be replaced by inductors which will achieve the same isolation.

Referring now to FIG. 3, there is shown an electronic device 46 farming the circuit 10 of the present invention. The electronic device 46 comprises a flat substrate 48 of an insulating material, such as alumina or plastic, having a flat surface 50. On the surface 50 and at one edge 52 of the substrate 48 is an area 54 of a layer of a conductive metal. The conductive metal area 54 serves as the RF input terminal 16 and as one plate of the capacitor 38. A layer 56 of a dielectric material is on a portion of the surface 50 and extends over the portion of the metal area 54 which forms the plate of the capacitor 38. An area 58 of a layer of a conductive metal is on a portion of the dielectric layer 56 and extends over the portion of the conductive metal area 54 which forms the plate of the capacitor 38. Thus, a portion of the conductive metal area 58 forms the other plate of the capacitor 38.

Two areas 60 and 62 of layers of a temperature sensitive resistance material, one having a positive temperature coefficient of resistance and the other having a negative temperature coefficient of resistance, are on the dielectric layer 56. Each of the resistance areas 60 and 62 overlaps the conductive metal area 58. The resistance areas 60 and 62 form the first and second temperature sensitive resistors 24 and 26 with the conductive metal area 58 forming their common junction 28. Two more areas 64 and 66 of layers of a temperature sensitive resistance material, one having a positive temperature coefficient of resistance and the other having a negative temperature coefficient of resistance, are on the dielectric layer 56. The resistance areas 64 and 66 form the third and fourth temperature sensitive resistors 30 and 32. An area 68 of a layer of a conductive metal is on the dielectric layer 56 between the resistance areas 64 and 66. The resistance areas 64 and 66 overlap the conductive metal area 68 which forms the common junction 34 between the third and fourth temperature sensitive resistors 30 and 32. An area 70 of a layer of a conductive metal is on the dielectric layer 56 and extends along the resistance area 60 and 64 which have the same temperature coefficient of resistance. The resistance areas 60 and 64 overlap the conductive metal area 70 so as to be electrically connected thereto.

An area 71 of a layer of a conductive metal (see FIG. 4) is on the surface 50 of the substrate 48 beneath the dielectric layer 56 and beneath a portion of the conductive metal area 70. This metal area 71 forms one plate of the coupling capacitor 40 with a portion of the conductive metal area 70 forming the other plate of the capacitor 40. Three areas 72, 74 and 76 of a layer of a conductive metal are on the surface 50 of the substrate 48 and are spaced apart along an edge 78 of the substrate 48. Each of the conductive metal areas 72, 74 and 76 extends over a portion of the dielectric layer 56. An area 80 of a layer of a resistance material is on the dielectric layer 56 and extends between the metal area 70 and the metal area 74. The metal area 74 serves as the DC input terminal 18 and the resistance area 80 serves as the dropping resistor 42. A strip 82 of a layer of a resistance material is on the dielectric layer 56 and extends between the conductive metal area 58 and the conductive metal area 72. The conductive metal area 72 serves as the output terminal 20 and the resistance strip 82 serves as one of the isolation resistors 44. A strip 84 of a layer of a resistance material is on the dielectric layer 56 and extends between the conductive metal area 68 and the conductive metal area 76. The conductive metal area 76 serves as the output terminal 22 and the resistance strip 84 serves as one of the isolation resistors 44. Thus, there is provided the circuit 10 shown in FIG. 2 on a flat substrate 48. The conductive metal areas 54, 72, 74 and 76 forming the input and output terminals may be extended over the edges 52 and 78 of the substrate 48 to the other surface thereof for surface mounting the electronic device 46.

Figure 5:
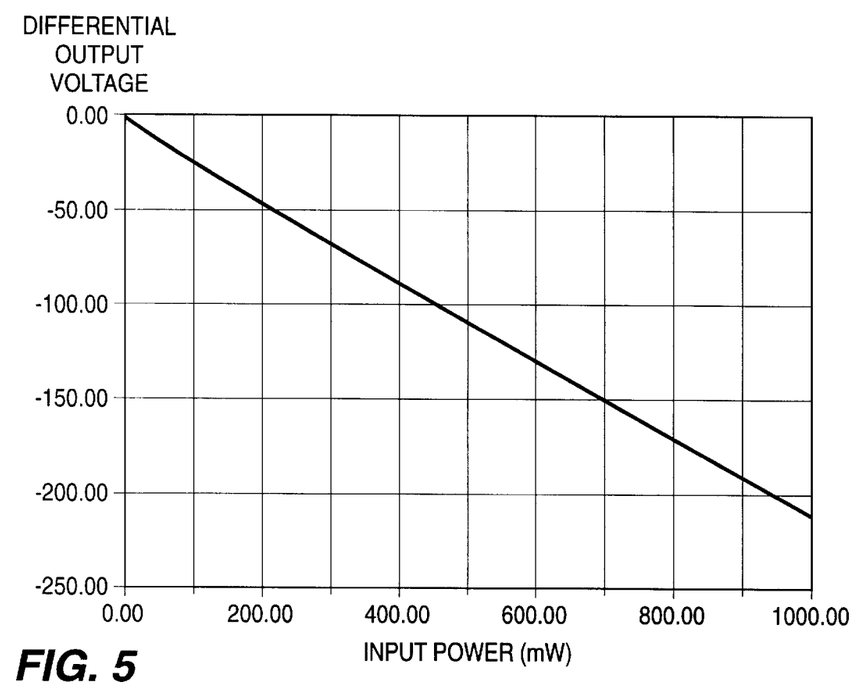
FIG. 5 is a diagram showing the output power vs. the voltage for a circuit made in accordance with FIG. 3.
Figure 6:
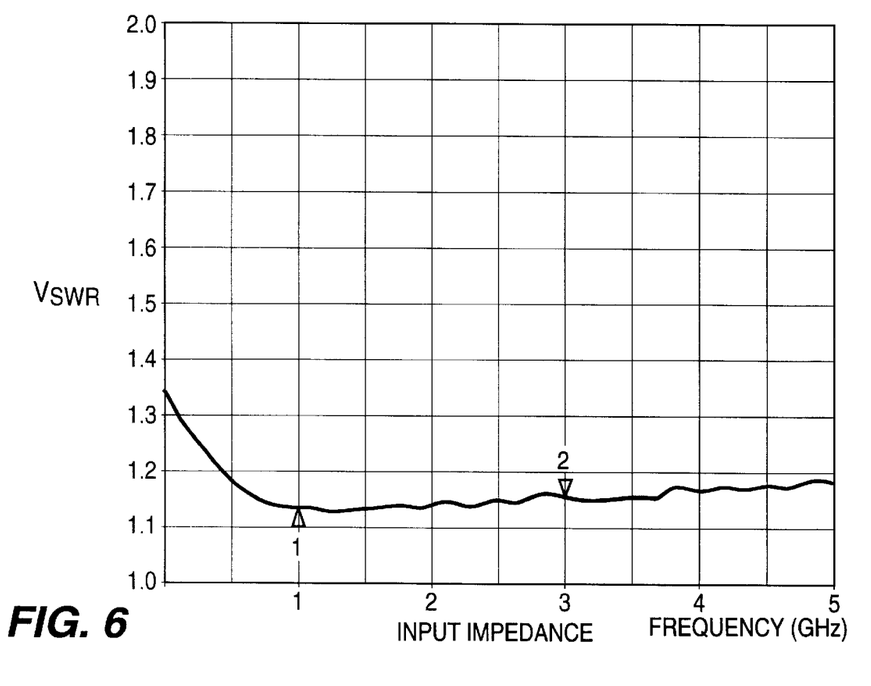
FIG. 6 is a diagram showing the termination resistance of the circuit vs. The changes in power.
Figure 7:
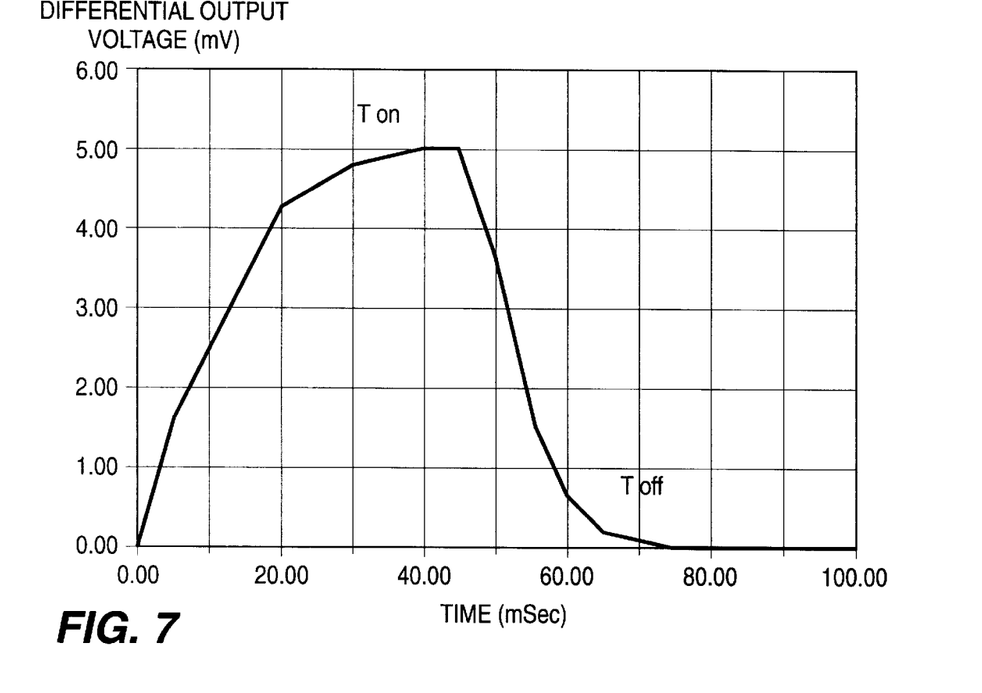
FIG. 7 is a diagram showing the time response for the circuit.

A power sensing termination was made in accordance with the structure shown and described with regard to FIG. 3 with each of the temperature sensitive resistors 24, 26, 30 and 32 having a resistance value of 100 ohms at 25° C. but with the first and third temperature sensitive resistors 24 and 30 having a positive temperature coefficient of resistance of 3,000 ppm/°C., and the second and fourth temperature sensitive resistors 26 and 32 having a negative temperature coefficient of resistance of 3,000 ppm/°C. The dropping resistor 42 was 300 ohms, and each of the isolation resistors were of 200 kohms. The capacitors 38 and 40 were 100 pF. FIG. 5 is a diagram showing the output power verses the input DC voltage of the device. It can be seen from this diagram that the output power was linear. FIG. 6 is a diagram of the termination resistance verses the power. It can be seen from this diagram that the termination resistance remained substantially constant. FIG. 7 shows the time response of the device. It can be seen from this diagram that the device responded rapidly. Thus, the device provided a linear showing of any change in power while retaining a substantially inform termination resistance and had a good time response.

Figure 8:
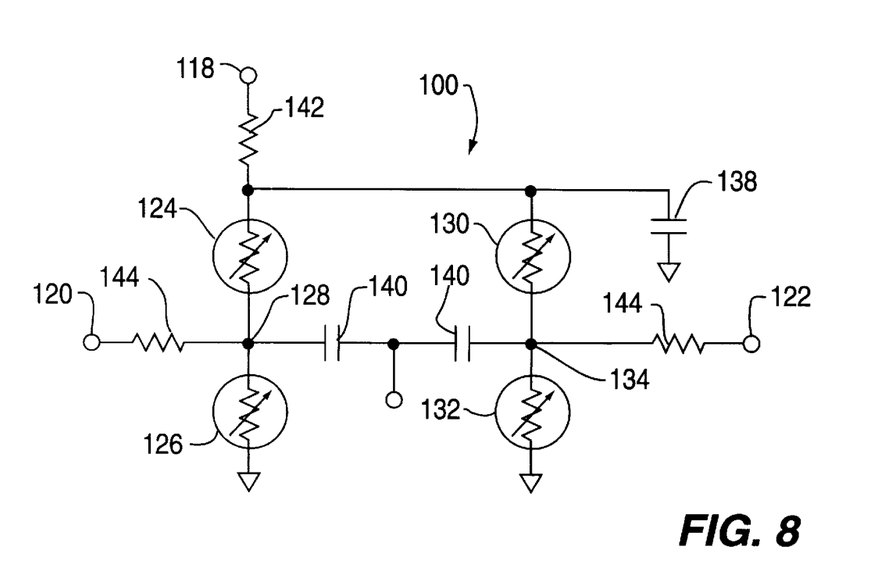
FIG. 8 is a circuit diagram of another form of the circuit of the present invention.

Referring to FIG. 8, there is shown a modification 100 of the circuit of the present invention. Circuit 100 is similar to circuit 10 shown in FIG. 2 in that it comprises first and second temperature sensitive resistors 124 and 126 connected to a common junction 128 and third and fourth temperature sensitive resistors 130 and 132 connected to a common junction 134. The temperature sensitive resistors 124, 126, 130 and 132 all have the same nominal resistance at room temperature. However, the first and third temperature sensitive resistors 124 and 130 have a positive temperature coefficient of resistance and the second and fourth temperature sensitive resistors 126 and 132 have a negative temperature coefficient of resistance.

A DC input terminal 118 is connected to each of the first and third temperature sensitive resistors 124 and 130 through a dropping resistors 142, and a capacitor 138 is connected to each of the first and third temperature sensitive resistors 124 and 130. An output terminal 120 is connected to the common junction 128 through an isolation resistors 144, and an output terminal 122 is connected to the common junction 134 through an isolation resistor 144. However, the RF input terminal 116 is not only connected to the common junction 128 between the first and second temperature sensitive resistors 124 and 126, as in the circuit 10, but is also connected to the common junction 134 between the third and fourth temperature sensitive resistors 130 and 132. A separate coupling capacitor 140 is between the RF terminal 116 and each of the common junctions 128 and 134.

The circuit 100 of the present invention operates in substantially the same manner as the circuit 10 described above in that the output voltage at the output terminal 120 is proportional to changes in the power at the RF input terminal 16 while the termination resistance remains substantially constant. However, in the circuit 100, the RF input power is also applied to the third and fourth temperature sensitive resistors 130 and 132 so that the voltage at the output terminal 122 is also proportional to changes in the RF input power. Therefore, in the circuit 100, the third and fourth temperature sensitive resistors 130 and 132 do not provide ambient temperature compensation. In the circuit 100 the difference between the voltages at the output terminals 120 and 122 remain a linear relationship with the RF input power, but the slope of the relationship will change. This provides a greater sensitivity so that the circuit 100 is best suited for applications where the sensitivity of the sensor is more important than temperature stability.

Figure 9:
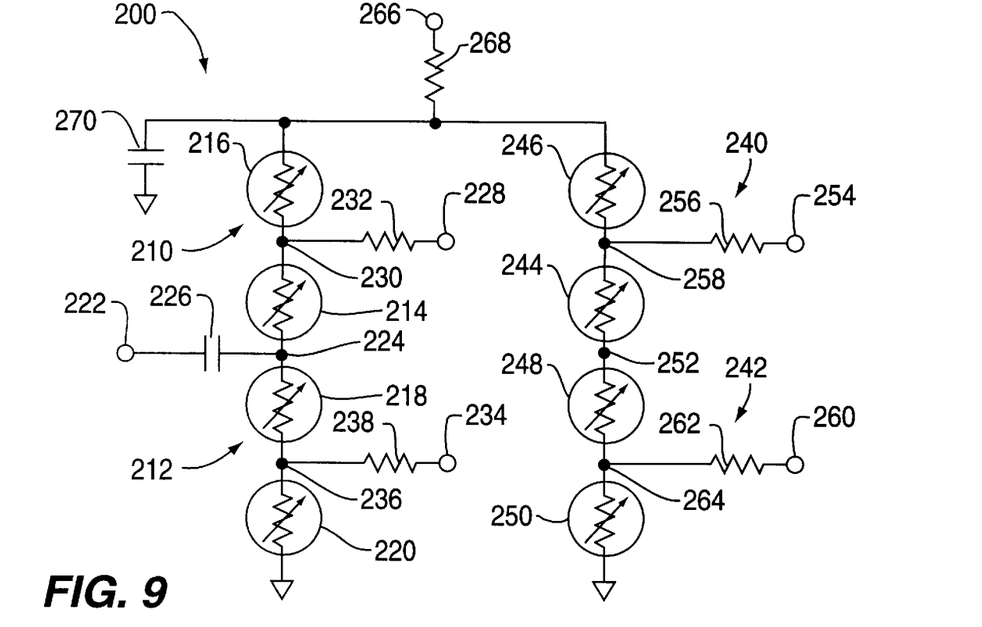
FIG. 9 is a circuit diagram of still another form of the circuit of the present invention.

Although the sensing circuit of the present invention shown in FIG. 2 operates stop satisfactorily to achieve the desired results, there is a problem at high powers. When operating at high powers, the variation of the output power vs. input power deviates from a straight line due to mismatch loss. Also input impedance changes at high power. Referring to FIG. 9, there is shown a modification of the sensing circuit, generally designated as 200, which overcomes this problem. Sensing circuit 200 comprises two sets 210 and 212 of temperature sensitive resistors, such as thermistors. The set 210 has a first temperature sensitive resistor 214 having a positive temperature coefficient of resistance, and a second temperature sensitive resistor 216 having a negative temperature coefficient of resistance. The temperature sensitive resistors 214 and 216 are connected in series. The set 212 of temperature sensitive resistors also has a first temperature sensitive resistor 218 having a positive temperature coefficient of resistance, and a second temperature sensitive resistor 220 having a negative temperature coefficient of resistance. The temperature sensitive resistors 218 and 220 are also electrically connected in series. The two sets of temperature sensitive resistors 210 and 212 are electrically connected in parallel with a RF input terminal 222 with the temperature sensitive resistors 214 and 218 having positive temperature coefficient of resistance being connected to a common junction 224 with the RF input terminal 222. A capacitor 226 is connected between the RF input terminal 212 and the common junction 224. A first output terminal 228 is connected to the common junction 230 between the first and second temperature sensitive resistors 214 and 216 of the set 210 through a resistor 232. A second output terminal 234 is connected to the common junction 236 between the first and second temperature sensitive resistors 218 and 220 of the set 212 through a resistor 238.

The circuit 200 also comprises two additional sets 240 and 242 of temperature sensitive resistors, such as thermistors. The set 240 of temperature sensitive resistors includes a first temperature sensitive resistor 244 having a positive temperature coefficient of resistance, and a second temperature sensitive resistor 246 having a negative temperature coefficient of resistance. The temperature sensitive resistors 244 and 246 are electrically connected in series. The set 242 of temperature sensitive resistors includes a first temperature sensitive resistor 248 having a positive temperature coefficient of resistance, and a second temperature sensitive resistor 250 having a negative temperature coefficient of resistance. The temperature sensitive resistors 248 and 250 of the set 242 are electrically connected in series. The sets 242 and 244 of temperature sensitive resistors are electrically connected in series with the first temperature sensitive resistors 244 and 248 having a positive temperature coefficient of resistance between connected together at a common junction 252.

A third output terminal 254 is connected through a resistor 256 to the common junction 258 of the first and second temperature sensitive resistors 244 and 246 of the set 240. A fourth output terminal 260 is connected through a resistor 262 to the common junction 264 of the first and second temperature sensitive resistors 248 and 250 of the set 242. A DC input terminal 266 is connected to the first temperature sensitive resistors 216 and 246 of the sets 210 and 240 through a dropping resistor 268. A coupling capacitor 270 is also connected to the first temperature sensitive resistors 216 and 246.

The circuit 200 operates in a manner similar to that of the circuit 10 of FIG. 2, previously described. The sets 210 and 212 of temperature sensitive resistors serve as a power detection side, and the sets 240 and 242 of temperature sensitive resistors serve as a temperature compensating side. When DC power is provided at the DC input terminal 266 and RF power is provided at the RF input terminal 222, the output power at the first and second output terminals 228 and 234 are proportional to changes in the RF input power. However, since each set of temperature sensitive resistors includes resistors having both positive and negative temperature coefficients of resistance, the termination resistance will not change with changes in the RF input power. Likewise, changes in the RF power caused by changes in the ambient temperature are indicated at the third and fourth output terminals 254 and 260. The input power is thus proportional (linear) to $(V_1-V_3)-(V_2-V_4)$, where $V_1$, $V_2$, $V_3$ and $V_4$ are the outputs at the first, second, third and fourth output terminals 228, 234, 254 and 260 respectively. However, since each set of the temperature sensitive resistors includes resistors having negative and positive temperature coefficient of resistance, the output remains substantially linear with respect to changes in the RF input power over a much higher range of powers and at much higher powers than is achieved with the circuit 10 shown in FIG. 2.

Figure 10:
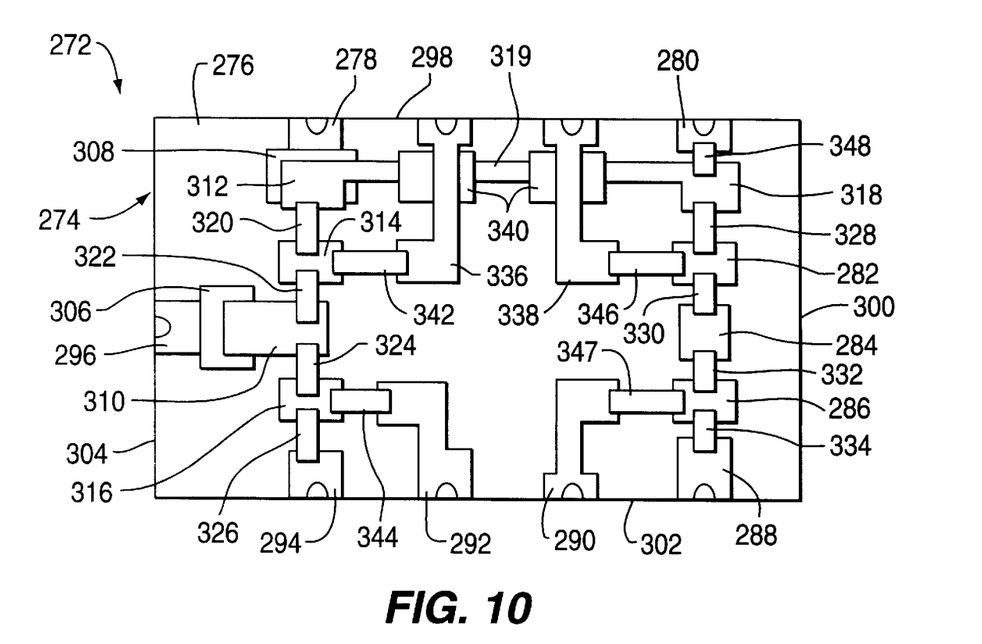
FIG. 10 is a top view of an electronic device forming the circuit shown in FIG. 9.

Referring to FIG. 10, there is shown an electronic device 272 forming the circuit 200 of the present invention. The electronic device 272 comprises a flat substrate 274 of an insulating material, such as alumina or plastic, having a flat surface 276. On the surface 276 of the substrate 274 are a plurality of areas 278, 280, 282, 284, 286, 288, 290, 292, 294 and 296 of a layer of a conductive metal. The area 278 is at and extends inwardly from one edge 298 of the substrate 274 and serves as a ground terminal and as one plate of the coupling capacitor 270. The area 280 is also at the edge 298 of the substrate 274 but is spaced from the area 278. The area 280 serves as the DC input terminal 266. The areas 282, 284, 286 and 288 are spaced apart along the edge 300 of the substrate 274 with the area 288 also being at the edge 302 of the substrate 274. The area 282 serves as the common junction 258 between temperature sensitive resistors 244 and 246, the area 284 serves as the common junction 252 between temperature sensitive resistors 244 and 248, the area 286 serves as the common junction 264 between the temperature sensitive resistors 248 and 250, and the area 288 serves as a ground terminal. The areas 290, 292, and 294 are spaced along and extend inwardly from the edge 302 of the substrate 274. The area 290 serves as the fourth output terminal 260, the area 292 serves as the second output terminal 234, and the area 294 serves as a ground terminal. The area 296 is at and extends inwardly from the edge 304 of the substrate 274. The area 296 serves as the RF input terminal 232 and as one plate of the capacitor 226.

Areas 306 and 308 of a layer of a dielectric material are over portions of the metal areas 296 and 278 respectively to form the dielectric of the capacitors 226 and 270 respectively. An area 310 of a conductive metal is over the dielectric area 306 and extends inwardly therefrom. The metal area 310 serves as the second plate of the capacitor 226 and as the common junction 224 between the temperature sensitive resistors 214 and 218. An area 312 of a conductive metal is over a portion of the dielectric area 308 and serves as the other plate of the capacitor 270. An area 314 of a conductive metal is on the substrate surface 276 between the metal areas 310 and 312 and serves as the common junction 230 between the temperature sensitive resistors 214 and 216. An area 316 of a conductive metal is on the substrate surface 276 between the metal areas 310 and 294 and serves as the common junction 236 between the temperature sensitive resistors 218 and 220. An area 318 of a conductive metal is on the substrate surface 276 between the metal areas 280 and 282. A strip 319 of a conductive metal is on the substrate surface 276 and extends between and electrically connects the metal areas 312 and 318.

A strip 320 of a temperature sensitive resistance material having a negative temperature coefficient of resistance is on the substrate surface 276 and extends between the metal areas 312 and 314. A strip 322 of a temperature sensitive resistance material having a positive temperature coefficient of resistance is on the substrate surface 276 and extends between the metal areas 310 and 314. The resistance strips 320 and 322 form the temperature sensitive resistors of the set 210. A strip 324 of a temperature sensitive resistance material having a positive temperature coefficient of resistance is on the substrate surface 276 and extends between the metal areas 310 and 316. A strip 326 of a temperature sensitive resistance material having a negative temperature coefficient of resistance is on the substrate surface 276 and extends between the metal areas 316 and 294. The resistance strips 324 and 326 form the temperature sensitive resistors of the set 212.

A strip 328 of a temperature sensitive resistance material having a negative temperature coefficient of resistance is on the substrate surface 276 and extends between the metal areas 282 and 318. A strip 330 of a temperature sensitive resistance material having a positive temperature coefficient of resistance is on the substrate surface 276 and extends between the metal areas 282 and 284. The resistance strips 328 and 330 form the set 240 of temperature sensitive resistors. A strip 332 of a temperature sensitive resistance material having a positive temperature coefficient of resistance is on the substrate surface 276 and extends between the metal areas 284 and 286. A strip 334 of a temperature sensitive resistance material having a negative temperature coefficient of resistance is on the substrate surface 276 and extends between the metal areas 286 and 288. The resistance strips 332 and 334 form the set 250 of temperature sensitive resistors.

Areas 336 and 338 of a conductive metal are on the substrate surface 276 adjacent but spaced from the metal areas 314 and 282 respectively. The metal areas 336 and 338 extend to the edge 298 of the substrate 274 to form the first and third output terminals 228 and 254 respectively. The metal areas 336 and 338 cross over the metal strip 319 and are insulated therefrom by layers 340 of an insulating material. A strip 342 of a resistance material is on the substrate surface 276 and extends between the metal areas 314 and 336 to form the resistor 232. A strip 344 of a resistance material is on the substrate surface 276 and extends between the metal areas 316 and 292 to form the resistor 238. A strip 346 of a resistance material is on the substrate surface 276 and extends between the metal areas 282 and 338 to form the resistor 256. A strip 347 of a resistance material is on the substrate surface 276 and extends between the metal areas 286 and 290 to form the resistor 262. A strip 348 of a resistance material is on the substrate surface 276 and extends between the metal areas 280 and 318 to form the dropping resistor 268. Thus, there is provided the circuit 200 on a flat substrate 210.

Thus, there is provided by the present invention, a sensing circuit which provides an indication of changes in RF power while still maintaining a substantially uniform termination resistance. The circuit can be temperature compensated so that its output is not affected by changes in the ambient temperature. Alternatively, the circuit can be made more sensitive where sensitivity is more important than temperature compensation. Also, the circuit can be made so that it is more linear at high power levels. Although specific values for the various components of the circuit 10 have been given as illustrative, it should be understood that these values can be varied. For example, the temperature coefficient of resistance of the temperature sensitive resistors may be varied to alter the sensitivity of the circuit. Also, the value of the dropping resistor may be changed to adjust the supply voltage range.

What is claimed is:

1. A power detector for an RF circuit comprising:
   an RF input;
   first and second temperature sensitive resistors connected together with a common junction to which the RF input is connected, the first temperature resistor having a positive temperature coefficient of resistance and the second temperature sensitive resistor having a negative temperature coefficient of resistance;
   an output terminal connected to the common junction of said first and second temperature sensitive resistors;
   means for applying a DC voltage to one of the temperature sensitive resistors;
   third and fourth temperature sensitive resistors connected together with a common junction, the third temperature sensitive resistor having a positive temperature coefficient of resistance and the fourth temperature sensitive resistor having a negative temperature coefficient of resistance;
   a second output terminal connected to the common junction of the third and fourth temperature sensitive resistors; and
   the means for applying a DC voltage is also connected to one of the third and fourth temperature sensitive resistors.

2. The power detector in accordance with claim 1 in which all of the temperature sensitive resistors have substantially the same nominal resistance at room temperature and substantially the same temperature coefficient of resistance value.

3. The power detector in accordance with claim 2 in which the means for applying a DC voltage is an input terminal.

4. The power detector in accordance with claim 3 in which the DC input terminal is connected to the two temperature sensitive resistors which have the same temperature coefficient of resistance.

5. The power detector in accordance with claim 4 further comprising a first capacitor connected between the RF input terminal and the common junction between the first and second temperature sensitive resistors.

6. The power detector in accordance with claim 5 further comprising a second capacitor having one plate connected to the DC input terminal and the two temperature sensitive resistors having the same temperature coefficient of resistance.

7. The power detector in accordance with claim 6 further comprising a resistor connected between the DC input terminal and the two temperature sensitive resistors having the same temperature coefficient of resistance.

8. The power detector in accordance with claim 7 further comprising a separate resistor connected between each of the output terminals and the common junction of the two temperature sensitive resistors.

9. The power detector in accordance with claim 8 in which the RF input terminal is also connected to the common junction between the third and fourth temperature sensitive resistors.

10. The power detector in accordance with claim 9 further comprising a capacitor connected between the RF input terminal and the common junction between the third and fourth temperature sensitive resistors.

11. The power detector in accordance with claim 1 including two sets of temperature sensitive resistors with each set having a first temperature sensitive resistor with a positive temperature coefficient of resistance and a second temperature sensitive resistor with a negative temperature coefficient of resistance, the temperature sensitive resistors in each set being connected in series and the two sets are connected in parallel to the RF input through a common junction of the two sets; separate output terminals are connected to the common junction of the first and second temperature sensitive resistors of each set; and the means for applying a DC voltage is connected to the temperature sensitive resistor of one set.

12. The power detector in accordance with claim 11 further comprising two additional sets of temperature sensitive resistors connected in series with each of the sets having a first temperature sensitive resistor with a positive temperature coefficient of resistance connected in series with a second temperature sensitive resistor with a negative temperature coefficient of resistance, and a separate output terminal connected to the common junction between the first and second temperature sensitive resistors of each set, and the means for applying a DC voltage is also connected to one of the temperature sensitive resistors of one of the additional sets.

13. The power detector in accordance with claim 12 in which the temperature sensitive resistors of the two sets having the same temperature coefficient of resistance are connected together and to the common junction with the RF input, and the temperature sensitive resistors of the two additional sets having the same temperature coefficient of resistance are connected together at a common point.

14. The power detector in accordance with claim 13 further comprising a first capacitor connected between the RF input and the common junction between the two sets of temperature sensitive resistors, and a second capacitor having a plate connected to the DC input and the temperature sensitive resistors to which the DC input is connected.

15. The power detector in accordance with claim 14 further comprising a resistor connected between the DC input and the temperature sensitive resistors of the two sets that the DC input is connected, and a separate resistor connected between each of the output terminals and the common junction of the temperature sensitive resistor of each respective set of temperature sensitive resistors.

16. An electronic device for detecting the power of an RF circuit comprising:

a substrate of an insulating material having a substantially flat surface and a plurality of edges;

first and second areas of a layer of a temperature sensitive resistance material on said substrate surface, the material of the first area having a positive temperature coefficient of resistance and the material of the second area having a negative temperature coefficient of resistance;

an area of a layer of conductive metal on said substrate surface connecting said first and second temperature sensitive resistance areas;

an area of a layer of a conductive metal on said substrate surface adjacent an edge of the substrate and forming an RF input terminal;

means on said substrate surface electrically connecting the RF input terminal to the conductive metal area connecting the first and second temperature sensitive resistance areas;

an area of a layer of a conductive metal on the substrate surface adjacent an edge of the substrate and forming a DC input terminal;

means on said substrate surface electrically connecting the DC input terminal area to one of the first and second temperature sensitive resistance areas;

an area of a layer of a conductive metal on said substrate surface adjacent an edge of the substrate and forming an output terminal; and means electrically connecting the output terminal area to the conductive metal area connecting the first and second temperature sensitive resistance areas.

17. The electronic device of claim 16 in which the means connecting the first and second temperature sensitive resistance areas forms a common junction therebetween, and the RF input terminal and the output terminal are electrically connected to the common junction.

18. The electronic device of claim 17 further comprising:

third and fourth areas of a layer of a temperature sensitive material on said substrate surface, the material of the third area having a positive temperature coefficient of resistance and the material of the fourth area having a negative temperature coefficient of resistance;

an area of a layer of a conductive metal on said substrate surface connecting said third and fourth temperature sensitive resistance areas and forming a common junction therebetween;

an area of a layer of a conductive metal on said substrate surface adjacent an edge of the substrate forming a second output terminal;

means on said substrate surface electrically connecting the second output terminal to the common junction area between the third and fourth temperature sensitive resistance areas; and the means connecting the DC input terminal area to one of the first and second temperature sensitive resistance areas also connecting the DC input terminal area to one of the third and fourth temperature sensitive resistance areas.

19. The electronic device of claim 18 further comprising:

a layer of a dielectric material on said substrate surface;

each of the temperature sensitive resistance areas being on the dielectric layer;

the RF input terminal area has a portion which extends under the dielectric layer; and each of the output terminal areas and the DC input terminal area has a portion which extends over the dielectric layer.

20. The electronic device of claim 19 in which the means electrically connecting the first and second temperature sensitive resistance areas and forming the common junction therebetween comprises an area of a layer of a conductive metal on the dielectric layer and contacting each of the first and second temperature sensitive resistance areas, a portion of the connecting area overlaps at least a portion of the RF input terminal area which extends under the dielectric layer to form a capacitor therewith.

21. The electronic device of claim 20 in which the means electrically connecting the third and fourth temperature sensitive resistance areas and forming a common junction therebetween comprises an area of a layer of a conductive metal on the dielectric layer and contacting each of the third and fourth temperature sensitive resistance areas.

22. The electronic device of claim 21 in which the means connecting the DC input terminal to the respective temperature sensitive resistance areas comprises an area of a layer of a conductive metal on the dielectric layer and contacting each of the respective temperature sensitive resistance areas.

23. The electronic device of claim 22 in which the means electrically connecting the DC input terminal area to the respective temperature sensitive resistance areas further comprises an area of a resistance material on said dielectric layer and extending between the DC terminal area and the conductive metal area which contacts the respective temperature sensitive resistance areas.

24. The electronic device of claim 23 in which the means electrically connecting each of the output terminal areas to the common junction area of the temperature sensitive resistance area comprises a separate strip of a resistance material extending over the dielectric layer between each of the output terminal areas and each of the common junction areas.

25. The electronic device of claim 24 further comprising an area of a layer of a conductive metal on the substrate surface beneath the dielectric layer and under a portion of the conductive metal area forming the connection between the DC input terminal area and the respective temperature sensitive resistance areas to form a capacitor therewith.

26. The electronic device of claim 16 further comprising four areas of a layer of a temperature sensitive resistance material on said substrate surface, the material of two of said areas having a positive temperature coefficient of resistance and the material of the other two areas having a negative temperature coefficient of resistance;

a pair of areas of a layer of a conductive metal on said substrate surface, each of said conductive metal areas electrically connecting a separate one of the temperature sensitive resistors having a positive temperature coefficient of resistance to a separate one of the temperature sensitive resistors having a negative temperature coefficient of resistance to form two sets of temperature sensitive resistors each having a negative temperature coefficient of resistance resistor electrically connected in series with a positive temperature coefficient of resistance resistor;

an area of a layer of a conductive metal on said substrate surface electrically connecting a temperature sensitive resistor of one of the sets to one of the temperature sensitive resistors of the other set to form a common junction therebetween;

the RF input terminal is electrically connected to the conductive metal area forming the common junction between the two sets of temperature sensitive resistors;

a pair of areas of a layer of a conductive metal are on the substrate surface forming a first pair of output terminals;

separate means electrically connecting each of the first pair of output terminals to a separate one of the conductive metal areas which electrically connect the temperature sensitive resistors of each set; and the DC input terminal is electrically connected to one of the temperature sensitive resistors of one of the sets.

27. The electronic device of claim 26 further comprising four additional areas of a layer of a temperature sensitive resistance material on said substrate surface, the material of two of said additional areas having a positive temperature coefficient of resistance and the material of the other two areas having a negative temperature coefficient of resistance;

a pair of areas of a conductive metal on said substrate surface with each of said conductive metal areas electrically connecting a separate one of the additional temperature sensitive resistors having a positive temperature coefficient of resistance to a separate one of the additional temperature sensitive resistors having a negative temperature coefficient of resistance to form two additional sets of temperature sensitive resistor with each set having a positive temperature coefficient of resistance resistor electrically connected in series with a negative temperature coefficient of resistance resistor;

an area of a conductive metal on said substrate surface and electrically connecting one of the temperature sensitive resistors of one of the additional sets to one of the temperature sensitive resistors of the other additional set;

two areas of a conductive metal on said substrate surface and forming two additional output terminals;

means electrically connecting each of said additional output terminal to a separate one of the conductive metal areas electrically connecting the temperature sensitive resistors of each of the additional sets; and the DC input terminal is also connected to one of the additional temperature sensitive resistors.

28. The electronic device of claim 27 in which the means electrically connecting each of the output terminals to its respective conductive metal area comprises a separate strip of a resistance material.

29. The electronic device of claim 28 in which the metal area forming the common junction between the two sets of temperature sensitive resistors overlaps a portion of the conductive metal areas forming the RF input terminal, and a layer of a dielectric material is between the two metal areas to form a capacitor therebetween.

* * * * *